TUNNEL DIODE TO TRANSISTOR INTERFACE CIRCUIT FOR INTERCONNECTING HIGH SPEED CIRCUITRY TO RELATIVELY SLOWER SPEED CIRCUITRY

Filed Dec. 1, 1964

INVENTOR.
THOMAS M. LOCASALE
BY
G. Donald Weber, Jr.
ATTORNEY

United States Patent Office 3,333,116

Patented July 25, 1967

3,333,116

TUNNEL DIODE TO TRANSISTOR INTERFACE CIRCUIT FOR INTERCONNECTING HIGH SPEED CIRCUITRY TO RELATIVELY SLOWER SPEED CIRCUITRY

Thomas M. Lo Casale, Warminster, Pa., assignor to Sperry Rand Corporation, New York, N.Y., a corporation of Delaware Filed Dec. 1, 1964, Ser. No. 415,019
10 Claims. (Cl. 307—88.5)

This invention relates to an interface circuit which may be used to interconnect relatively high speed tunnel diode circuitry and relatively slower speed transistor circuitry.

In the electronic art, various components are utilized for various purposes. For example, the tunnel diode provides rapid switching with little amplification. On the other hand, the transistor provides amplification with relatively slower switching. Each of these components is utilized for specific purposes in various electronic circuits such as electronic data processing machines, and the like. However, it is often found that the output from a tunnel diode circuit must be utilized as the input signal to a transistor circuit. Oftentimes, this operation will produce problems inasmuch as the transistor circuit cannot switch as rapidly as the tunnel diode circuit. Therefore, the amplification characteristics of the transistor are ineffective.

The instant circuit has been developed to interconnect high speed tunnel diode circuitry with relatively slower speed transistor circuitry thereby providing an interface circuit between the two types of circuitry. This circuit utilizes a tunnel diode and a transistor which are interconnected so that the input signals (supplied by other tunnel diode circuitry) switch the tunnel diode. The switching tunnel diode does not reswitch until reset by a delayed output signal from the transistor. Thus, the transistor has the ability to follow the operation of the tunnel diode in the instant circuit and, thereby, provide output signals which are indicative of certain input signals.

Thus, one object of this invention is to provide a circuit which converts ultra high speed, short duration signals into signals having sufficient amplitude and duration to drive existing transistor logic circuitry.

Another object of this invention is to provide an interface circuit between tunnel diode and transistor circuitry.

Another object of this invention is to provide a circuit which is utilized to provide an interrelationship between tunnel diode circuitry and transistor circuitry while being relatively simple and inexpensive to produce.

Another object of this invention is to provide a tunnel diode-transistor interface circuit which utilizes few components.

These and other objects and advantages of this invention will become more readily apparent when the following specification and description is read in conjunction with the attached drawings, in which.

Figure 1:
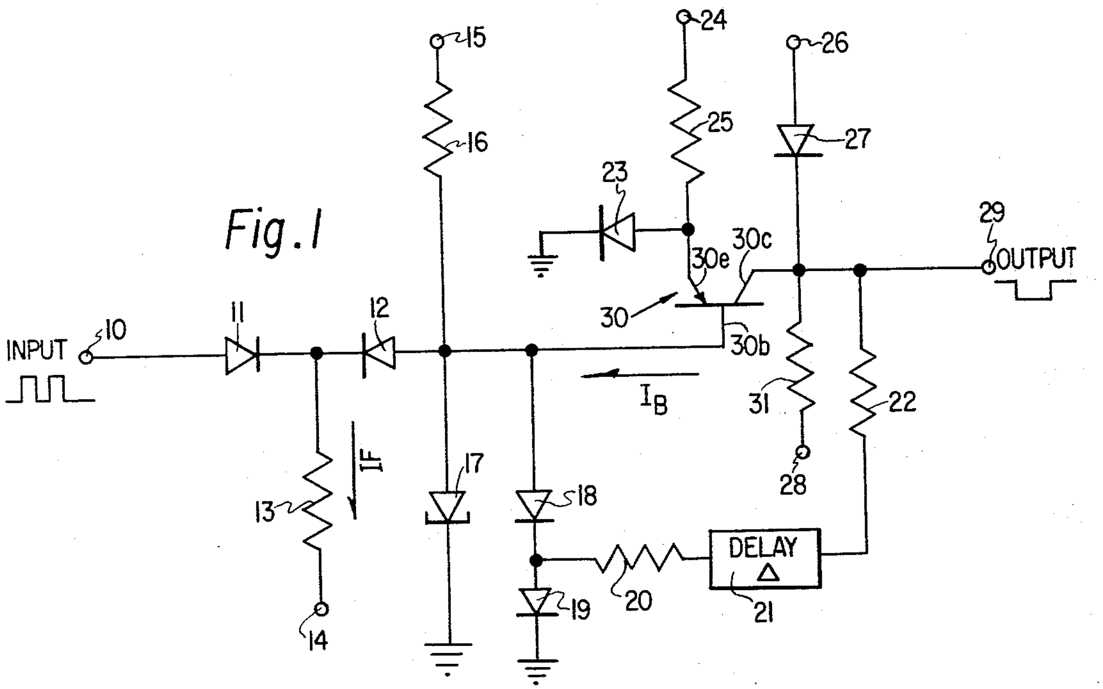
FIGURE 1 is a schematic diagram of one embodiment of the invention.

Referring now to FIGURE 1, there is shown one embodiment of the instant invention. The circuit described is not meant to be limited to the precise configuration shown in FIGURE 1 nor by the component types or values which are listed herewith. Rather, the circuit shown in FIGURE 1 is merely an illustrative embodiment of a preferred configuration for the circuit. In FIGURE 1, the input terminal 10 may be connected to any typical input source such as a logical switching circuit utilized in EDP circuitry. For example, a high speed logic circuit utilizing a tunnel diode as a switching element thereof (many of which are known in the art) may be attached to terminal 10. Terminal 10 is connected to the anode of coupling diode 11. Diode 11 may be any typical silicon rectifier diode which has a relatively high forward voltage drop, for example 700 millivolts, thereacross. The cathode of diode 11 is connected to source 14 via resistor 13 (2,000 ohms). Source 14 may actually comprise any typical source capable of supplying a substantially constant potential of approximately −20 volts which, when considered in conjunction with resistor 13, draws a substantially constant current of about 10 milliamperes. Also connected to the cathode of diode 11 is the cathode of diode 12. Diode 12 may be any typical germanium type diode which has a relatively low forward voltage drop, for example 300 millivolts, thereacross. The anode of diode 12 is connected to the anode of tunnel diode 17. Tunnel diode 17 may be any typical tunnel diode such as an RCA IN3129 which is a 20 milliampere peak-current tunnel diode. The cathode of tunnel diode 17 is connected to any suitable reference potential such as ground. The anode of tunnel diode 17 is connected to potential source 15 via resistor 16 (1,500 ohms). Potential source 15 which may be any typical type of source capable of supplying a substantially constant potential on the order of +30 volts provides, in conjunction with the resistor 16, a substantially constant current source. In addition, this current source biases tunnel diode 17 to the bistable mode of operation and to approximately one half the peak current value thereof. Also connected to the anode of tunnel diode 17, is the base **30*b* of transistor 30. The emitter 30*e* of transistor 30 is connected to potential source 24 via resistor 25 (820 ohms). Source 24 which may be the same as source 15 provides approximately +30 volts. Also connected to the emitter 30*e* is the anode of clamping diode 23. Clamping diode 23 may be any type of high conductance diode. The cathode of diode 23 is connected to any suitable reference potential source for example ground. The collector 30*c* of transistor 30 is connected to reference potential source 28 via resistor 31 (250 ohms). Source 28 which may be any conventional type of source supplies a substantially constant potential in the order of −7.0 volts. Also connected to the collector 30*c* is the cathode of clamping diode 27. Clamping diode 27 may be any typical germanium diode having a relatively low forward voltage drop thereacross. The anode of diode 27 is connected to reference potential source 26. Source 26 may be any conventional source capable of supplying a substantially constant potential on the order of −2.8 volts which clamps the output of the transistor when the transistor is turned off. The output terminal 29 is also connected to the collector 30*c* of the transistor 30 as is one terminal of resistor 22 (200 ohms). Another terminal of resistor 22 is connected to the input of delay line element 21. This delay element may have any desirable delay period, for example one complete cycle of the input signal. One terminal of resistor 20 (100 ohms) is connected to the output of the delay line. The other terminal of resistor 20 is connected to the connection between diodes 18 and 19. Diode 19, which may be any typical germanium diode having a relatively low forward voltage drop thereacross, is connected between a suitable reference potential, for example ground, at the cathode thereof and the aforesaid terminal of resistor 20 at the anode thereof. The anode of diode 19 is connected to the cathode of diode 18 which has the anode thereof connected to the anode of tunnel diode 17. Diode 18** may be any typical silicon type diode which has a relatively high forward voltage drop thereacross.

Figure 2:
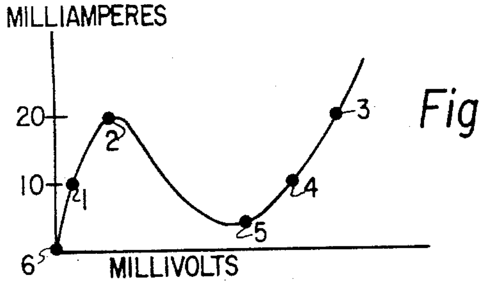
FIGURE 2 is a graphic representation of the operating characteristics of the tunnel diode in the circuit.

Referring now to FIGURE 2, there is shown a graphic display of the voltage-current characteristic for the tunnel diode. This characteristic is typical of tunnel diodes. That is, there are two stable conditions represented by the 6–1–2 region and the 5–4–3 region. These stable regions are separated by an unstable (negative resistance) region 2–5. Typically, under no load conditions, the tunnel diode 17 is biased in one of the stable operating conditions 1 or 4. In condition 1, the current through the tunnel diode is on the order of 10 milliamperes and the voltage drop thereacross is on the order of 50 millivolts. In condition 4, the current through the tunnel diodes is also on the order of 10 milliamperes while the voltage drop thereacross is on the order of 450 millivolts. Under load conditions and under switching conditions these suggested parameters may vary somewhat. However, the detailed operation of the tunnel diode will be discussed in the description of the operation of the circuit shown in FIGURE 1.

Figure 3:
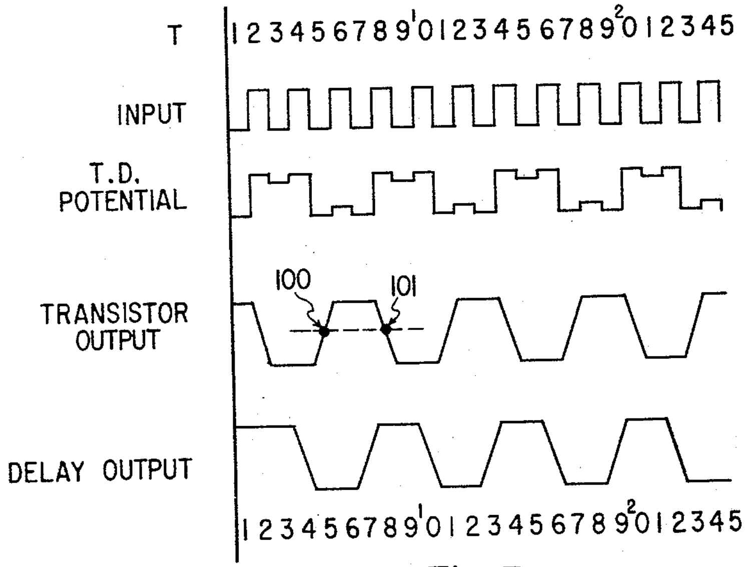
FIGURE 3 is a graphic representation of the signals produced by the circuit.

Referring now to FIGURE 3, there are shown graphic diagrams of the potential signals produced by the circuit. The significance of this figure, as well as FIGURE 2, will become apparent from the description of the operation of the circuit shown in FIGURE 1. The signal shown in the first line of FIGURE 3 represents the input signal supplied to terminal 10 of the circuit shown in FIGURE 1. This signal may be supplied by any typical tunnel diode high speed switching circuit as is known in the art. For purposes of illustration, it may be considered that the duration of each time period of FIGURE 3 is four nanoseconds. It is further assumed, for purposes of illustration, that the associated transistor circuitry (for example connected to output terminal 29) requires a signal with a minimum of 12 nanoseconds duration (at the action points, for example points 100 and 101), and a signal swing from about +0.2 volt to −2.5 volts. It will be seen that the input signal, which has a potential swing of approximately +50 to +450 millivolts, has neither the amplitude nor the duration required. Thus, this interface circuit is utilized.

As was described supra, the current sink comprising source 14 and resistor 13 draws a current $I_F$ which may be on the order of 10 milliamperes. Also, the current source comprising source 15 and resistor 16 is capable of supplying approximately 20 milliamperes. Consequently, when the input signal applied at terminal 10 is a low-level signal, as in the case at time period T1, diode 11 is reverse biased and diode 12 is forward biased. Thus, the current supplied by source 15 is divided between the current sink and the tunnel diode 17. Therefore, if it is initially assumed that the tunnel diode resides in the low voltage condition, a potential of approximately +50 millivolts is observed at the anode thereof and tunnel diode 17 is biased at operating point 1 (see FIGURE 2). The tunnel diode potential is, therefore, shown as a low level signal at time period T1 in FIGURE 3.

Similarly, the source comprising potential source 24 and resistor 25, connected to emitter 30*e*, supplies a current of about 30 milliamperes to transistor 30. The clamping network comprising diode 23 tends to clamp the emitter potential at about +450 (plus or minus about 40) millivolts. The voltage range at the emitter is determined by the load or no load conditions; for example, when transistor 30 is turned on the potential at emitter 30*e* is on the order of +410 millivolts and when the transistor is off, the potential at emitter 30*e* is about +490 millivolts.

Since, at time period T1, the base 30*b* of transistor 30 is maintained at approximately +50 millivolts by tunnel diode 17, transistor 30 is maintained on. Thus, the potential exhibited at the collector 30*c* of transistor 30 is on the order of +200 millivolts. This signal appears at the output terminal 29 and is also applied via resistor 22 to the delay line element 21. The output from the delay line is applied to the connection between the cathode of diode 18 and the anode of diode 19. However, inasmuch as diode 18 is reverse biased because of the +50 millivolt signal at the anode thereof and the signal of substantially +200 millivolts at the cathode thereof, this signal has no operative function at this time.

However, at time period T2 the input signal becomes a high level signal. This high level signal is on the order of +450 to +500 millivolts and is sufficiently large to forward bias diode 11 thereby reverse biasing diode 12. Thus, the current $I_F$ is supplied to current sink 14 by input source 10 via diode 11. Moreover, the current which was formerly supplied via diode 12 is now shunted through the tunnel diode 17 in addition to the original bias current. This additional current is designed to be sufficient (in view of the biasing of tunnel diode 17) to cause the tunnel diode to switch from the operating point 1 to operating point 3 via the peak potential point 2. When the tunnel diode 17 switches to the high voltage condition, the potential observed at the anode thereof is on the order of +500 millivolts. It will be clear that this potential which is applied to the base 30*b* is higher than the potential supplied to the emitter 30*e* whereby the transistor 30 is turned off. As the transistor is turned off, the potential at the emitter 30*e* rises to approximately +490 millivolts, as limited by clamp diode 23. The emitter and base potentials are such that transistor 30 remains turned off.

The turn-off or switching of transistor 30 is schematically represented as being slower than the switching to tunnel diode 17 by the slanting characteristic shown during time period T2 for the transistor output (see FIGURE 3). The transistor output is, of course, the output signal observed at terminal 29. As the transistor turns off, the voltage divider network between sources 26 and 28 comprising diode 27 and resistor 31 is effective to maintain the collector potential (also the output potential) at approximately −3.0 volts. This signal is also applied via resistor 22 to the delay element 21. Because of the delay of element 21, the low level transistor output signal is not applied to the midpoint connection of diodes 18 and 19 until time period T5. That is, the output signal from delay element 21 does not even begin to switch from the high level until time period T4. Thus, the high level input signal applied at time period T4 is ineffective to cause any change in the tunnel diode potential inasmuch as the tunnel diode is still in the high voltage condition.

That is, even though diode 12 is reverse biased, the additional current available merely switches the tunnel diode from operating point 4 to operating point 3. The tunnel diode potential, and, therefore, the transistor base potential, in either case is sufficiently high to maintain the transistor off.

It should be further noted, that the input signal and the biasing currents for tunnel diode 17 are so selected that the low level input signal at time period T3 merely causes tunnel diode 17 to switch from operating point 3 to operating point 4. This small potential variation (from +500 to +450 millivolts for example) is shown in FIGURE 3. It should be understood of course, that the application of the low level signal does not provide sufficient current variation to switch tunnel diode 17 back to low level operating condition 1.

At time period T5, the low level output signal produced by delay line 21 in response to the low level output signal from transistor 30 is applied to the cathode of diode 18. This low level signal is of sufficient magnitude to cause diode 18 to conduct. Diode 18 conducts sufficient current simultaneously with current flow through diode 12 to source 14 such that the current supplied to tunnel diode 17 has a value less than the valley current magnitude indicated by point 5 of FIGURE 2 whereby tunnel diode 17 switches back to the low voltage operating region, for example at point 6. Thus, the tunnel diode has been reset by a simultaneous applicaiton of low level signals which permit current flow from source 15 to source 14 via diode 12 and from source 15 to ground via diode 18.

Additionally, when the potential at the anode of tunnel diode 17 becomes sufficiently low due to being reset, transistor 30 begins to turn on. This is suggested by the slanted line during time period T5. Once tunnel diode 17 has been returned to the low voltage operating condition, the low low level signal supplied by the delay element 21 maintains the tunnel diode in this condition, for example see tunnel diode potential at time period T6. At time period T6, current of about 10 milliamperes continues to flow in diode 18. Thus, even though the input signal goes high, the operating point of tunnel diode 17 varies only between operating points 6 and 1. The potential variation is only from about 0 to +50 millivolts. Neither of these potential values is sufficient to turn-off transistor 30 as described supra.

At time period T7, the input signal becomes a low level signal. This low level input signal tends to forward bias diode 12 such that current flow therethrough may exist. Thus, the potential observed at the anode of tunnel diode 17 shifts from operating point 1 to operating point 6. In addition, the output signal from the delay element 21 (which follows the waveshape of the transistor output signal) begins to rise during time period T7. Thus, at time period T8 the output produced by delay element 21 is a high level signal. This high level signal reverse biases diode 18 such that current flow therethrough ceases. The cessation of current flow through diode 18 provides a current flow of approximately 10 milliamperes, i.e., the initial bias current, through tunnel diode 17. In addition, the high level input signal is applied at the same time. This high level input signal, as described supra, forward biases diode 11 and reverse biases diode 12. When diode 12 is reverse biased, the current which had previously flowed therethrough is now switched into tunnel diode 17 whereby tunnel diode 17 switches from the low to the high voltage operating condition. As described supra, when the potential exhibited at the anode of tunnel diode 17 becomes a high level potential, transistor 30 is turned off since this high level potential is applied to the base of the transistor. Thus, the transistor output signal shown in FIGURE 3 at time period T8 is represented by the slanted line. The output from the delay element 21 follows this transistor output and decreases during time period T10.

It will be seen that the operation of the circuit continues along the lines previously described. Thus, the input signal which is shown as a regularly recurring input signal continues to be applied. In the absence of a low level signal at the cathode of diode 18, tunnel diode 17 is switched to the high voltage operating condition by the application of a high level input signal. When the tunnel diode is in the high voltage operating condition, transistor 30 is turned off. The output from the transistor is detected at output 29 and is also fed back to the cathode of diode 18 via delay element 21. The delay element feedback path therefore provides an automatic reset scheme.

It should be understood of course, that the circuit shown is not limited to the precise wave forms shown and described. That is, the input signals need not be a regularly recurring train of signals such as is shown. The input signals could be in the form of output information supplied by a logic circuit or the like. It is required, however, that the output signals produced by such a logic circuit be in the form of at least a short "train" of pulses which would be at least sufficiently long in duration to permit the cycling of the circuit as described supra to be effective. This cycling may be a function of the delay time as well as the switching time and response time of transistor 30.

From the forgoing description, it will be understood that various changes may be made in the form, construction and arrangement of the parts, without departing from the scope of the invention, the form hereinbefore described being merely a preferred embodiment.

The embodiments of the invention in which an exclusive property or privilege is claimed are defined as follows:

1. In combination, input terminal means for selectively receiving input signals, first diode means connected to said input terminal means such that input signals at said input terminal means forward bias said first diode means, first current source means, first current sink means, second diode means connected to said first current source and said first current sink, said second diode being forward biased to pass current therethrough from said source to said sink except when said first diode means is forward diased, tunnel diode means exhibiting first and second stable operating conditions and being connected to said first current source and said second diode means in such a fashion that bias current may be applied thereto by said first current source whereby said tunnel diode exhibits said first stable operating condition and additional current may be applied thereto by said source when said first diode is forward biased whereby said tunnel diode exhibits said second stable operating condition, transistor means having a control element connected to said tunnel diode in such a fashion that the operating condition of said transistor may be varied in accordance with the operating condition exhibited by said tunnel diode, bias means connected to said transistor, output terminal means connected to said transistor, third diode means connected to said tunnel diode and to said control element of said transistor, and delay means connected to said output terminal and said third diode means whereby said tunnel diode may be selectively reset to said first operating condition in response to the conducting state of said third diode by signals produced by said transistor at a time delayed from the production of said signals.

2. The combination recited in claim 1 wherein said transistor operating conditions vary between conductive and nonconductive conditions said tunnel diode first and second operating conditions are characterized by low and high potential drops across the tunnel diode respectively and said transistor is conductive only when said tunnel diode exhibits said first operating condition.

3. The combination recited in claim 1 wherein said first and second diodes exhibit different forward voltage characteristics with said first diode having the higher forward voltage drop characteristic.

4. In combination input means for selectively receiving input signals current source means current sink means connected to said input means diode means connected to said current source and said current sink said diode being forward biased to pass current therethrough from said source to said sink except in the presence of an input signal tunnel diode means exhibiting high and low voltage operating conditions and being connected to said current source and said diode means in such a fashion that bias current may be applied thereto by said source whereby said tunnel diode is in said low voltage condition and additional current may be applied thereto by said source whereby said tunnel diode is in said high voltage condition when said diode is not forward biased, transistor means having a control element connected to said tunnel diode in such a fashion that said transistor conducts when said tunnel diode is in the low voltage condition and does not conduct when said tunnel diode is in the high voltage condition, bias means connected to said transistor, output terminal means connected to said transistor, further diode means connected to said tunnel diode and said control element of said transistor, and delay means connected between said output terminal and said further diode means in such a fashion that said tunnel diode may be selectively reset to said low voltage conditions in response to the conducting state of said further diode by signals produced by said transistor and said bias means at a time delayed from the production of said signals.

5. The combination recited in claim 4 wherein said bias means includes clamping means to control the magnitudes of the signals produced by said transistor when conducting and when not conducting.

6. The combination recited in claim 4 wherein said bias means includes voltage dividing means connected to said output terminal such that a predetermined signal level is produced thereat when said transistor is not conducting.

7. In combination, input means for selectively receiving input signals, current steering means connected to said input means, tunnel diode means exhibiting first and second stable operapting conditions and being connected to said current steering means in such a fashion that first current may be applied thereto whereby said tunnel diode exhibits said first operating condition and additional current may be applied thereto whereby said tunnel diode exhibits said second operating condition, transistor means having a control element, means connecting said tunnel diode and said current steering means with said control element of said transistor whereby the operating condition of said transistor may be varied in accordance with the operating condition of said tunnel diode, output means connected to said transistor, and delay means connected to said output means and said current steering means whereby said tunnel diode may be selectively reset by signals produced by said transistor in response to said tunnel diode operating condition and at a time delayed from the production of said signals.

8. The combination recited in claim 7 wherein said current steering means includes first diode means connected to said input means in such a fashion that said input signals forward bias said first diode means, first current source means, current sink means connected to said first diode means, second diode means connected to said first current source and said first current sink, said second diode being forward biased to pass current therethrough from said source to said sink except when said first diode means is forward biased, and third diode means connected to said tunnel diode.

9. The combination recited in claim 8 wherein the signals produced by said transistor are low level signals which forward bias said third diode means such that current passes therethrough from said source.

10. The combination recited in claim 1 wherein said delay means produces a time delay period which is a function of the frequency of said input signals and permits said transistor operating condition to be fully varied in response to the change in operating condition of said tunnel diode.

References Cited

UNITED STATES PATENTS 3,040,186 6/1962 Van Duzer -------- 307—88.5

OTHER REFERENCES

"Nanosecond High Current Pulse Circuit," by Lile in RCA Technical Notes, RCA TN No. 524, dated March 1962.

ARTHUR GAUSS, *Primary Examiner.*

S. D. MILLER, *Assistant Examiner.*